United States Patent
Kaji et al.

[19]

[11] Patent Number: 6,046,425
[45] Date of Patent: Apr. 4, 2000

[54] PLASMA PROCESSING APPARATUS HAVING INSULATOR DISPOSED ON INNER SURFACE OF PLASMA GENERATING CHAMBER

[75] Inventors: Tetsunori Kaji, Tokuyama; Takashi Fujii; Motohiko Yoshigai, both of Kudamatsu; Yoshinao Kawasaki, Yamaguchi-ken; Masaharu Nishiumi, Kudamatsu, all of Japan

[73] Assignee: Hitachi, Ltd., Tokyo, Japan

[21] Appl. No.: 08/474,136

[22] Filed: Jun. 7, 1995

Related U.S. Application Data

[63] Continuation-in-part of application No. 08/203,035, Feb. 28, 1994, Pat. No. 5,432,315, which is a continuation-in-part of application No. 07/890,184, May 29, 1992, Pat. No. 5,290,993.

[30] Foreign Application Priority Data

May 31, 1991 [JP] Japan .................................. 3-129064

[51] Int. Cl.$^7$ .................................................. B23K 10/00
[52] U.S. Cl. ................................ 219/121.43; 219/121.41; 219/121.52; 156/646.1; 156/345; 205/297.38
[58] Field of Search .......................... 219/121.41, 721.43, 219/121.44, 121.48, 121.52; 156/643.1, 646.1, 345; 204/298.37, 298.38, 298.18, 298.19; 118/723 I, 723 MW

[56] References Cited

U.S. PATENT DOCUMENTS

| | | |
|---|---|---|
| 4,491,496 | 1/1985 | Laporte et al. .......................... 156/345 |
| 4,673,456 | 6/1987 | Spencer et al. ..................... 204/298.38 |
| 4,985,109 | 1/1991 | Otsubo et al. ..................... 204/298.38 |
| 5,047,115 | 9/1991 | Charlet et al. .......................... 156/643 |
| 5,065,698 | 11/1991 | Koike ...................................... 118/719 |
| 5,069,938 | 12/1991 | Lorimer et al. ...................... 427/255.1 |
| 5,085,727 | 2/1992 | Steger .................................... 156/345 |
| 5,266,146 | 11/1993 | Ohno et al. ............................ 156/345 |
| 5,364,519 | 11/1994 | Fujimura et al. ...................... 156/345 |
| 5,366,585 | 11/1994 | Robertson et al. ..................... 156/643 |

Primary Examiner—Mark Paschall
Attorney, Agent, or Firm—Antonelli, Terry, Stout & Kraus, LLP

[57] ABSTRACT

A plasma processing apparatus includes a plasma processing chamber defining a plasma region. The plasma processing chamber has an inner metallic portion defining at least a portion of the plasma region. The plasma processing apparatus also includes a sample table disposed in the plasma region for holding a sample to be subjected to plasma processing, elements for applying an AC voltage to the sample table, elements for generating a plasma, including a region of intense plasma, in the plasma region independently of the AC voltage applied to the sample table such that the AC voltage applied to the sample table has no effect on the generation of the plasma, and an insulator having a thickness of several tens to several hundreds of micrometers ($\mu$m) disposed on the inner metallic portion of the plasma processing chamber in a neighborhood of the region of intense plasma.

21 Claims, 5 Drawing Sheets

PLASMA PROCESSING APPARATUS HAVING INSULATOR DISPOSED ON INNER SURFACE OF PLASMA GENERATING CHAMBER

CROSS-REFERENCES TO RELATED APPLICATIONS

This application is a continuation-in-part of application Ser. No. 08/203,035 filed on Feb. 28, 1994, now U.S. Pat. No. 5,432,315, which is a continuation-in-part of application Ser. No. 07/890,184 filed on May 29, 1992, now U.S. Pat. No. 5,290,993.

BACKGROUND OF THE INVENTION

The present invention relates to a plasma processing apparatus, and in particular to a plasma processing apparatus suitable for formation of various types of films, etching processing of such films, etc., performed in semiconductor element fabrication, etc.

Continued advances have been made in achieving downsizing and higher density integration of semiconductor elements. A microwave plasma processing apparatus is an example of a plasma processing apparatus suitable for use in achieving such downsizing and higher density integration.

A prior-art microwave plasma processing apparatus is described in Japanese Utility Model Publication Laid-Open No. 2-67632. The prior-art microwave plasma processing apparatus includes a vacuum chamber having an upper portion formed by a quartz bell jar, a processing gas introducing tube for introducing a processing gas into the vacuum chamber, a waveguide surrounding the quartz bell jar, a magnetron for generating microwaves connected to the waveguide, a coil for generating a magnetic field disposed around the quartz bell jar outside of the waveguide, a sample table disposed in the vacuum chamber, a high-frequency power supply connected to the sample table, and a movable ground plate disposed in the vacuum chamber around the sample table.

This prior-art microwave plasma processing apparatus operates as follows. A sample is placed on the sample table. A processing gas is introduced into the vacuum chamber through the processing gas introducing tube. Microwaves from the magnetron are introduced into the quartz bell jar through the waveguide while the coil generates a magnetic field in the quartz bell jar. A processing plasma is generated in the quartz bell jar by interaction of the processing gas, the microwaves, and the magnetic field. A high-frequency voltage from the high-frequency power supply is applied to the sample table, thereby applying the high-frequency voltage between the sample table and the ground plate and producing a bias voltage which attracts ions in the processing plasma towards the sample. The height of the ground plate is adjusted to provide a uniform potential distribution.

In this prior-art microwave plasma processing apparatus, no consideration was given to the possibility of metal contamination from the ground plate, and there was a problem that the ground plate was sputtered by ions in the processing plasma, thereby scattering metal particles from the ground plate into the vacuum chamber and contaminating the sample.

The object of the present invention is to provide a plasma processing apparatus capable of performing stable plasma processing of a sample without contaminating the sample with metal particles from a ground plate or other portions of the plasma processing apparatus exposed to a plasma.

SUMMARY OF THE INVENTION

In order to achieve the above object, a plasma processing apparatus includes a plasma processing chamber having inner metallic portions, a sample table disposed in the plasma processing chamber for holding a sample to be subjected to plasma processing, elements for generating a plasma in a plasma generating region in the plasma processing chamber, and an insulating liner disposed between the plasma generating region and parts of the inner metallic portions of the plasma processing chamber which would otherwise be exposed to the plasma generated in the plasma generating region, the insulating liner having an effective plasma barrier thickness of from several tens to several hundreds of micrometers. The insulating liner may be made of a ceramic material, or of a material selected from the oxides and fluorides of aluminum, magnesium, and tantalum, such as alumina.

DESCRIPTION OF THE PREFERRED EMBODIMENTS

Figure 1:
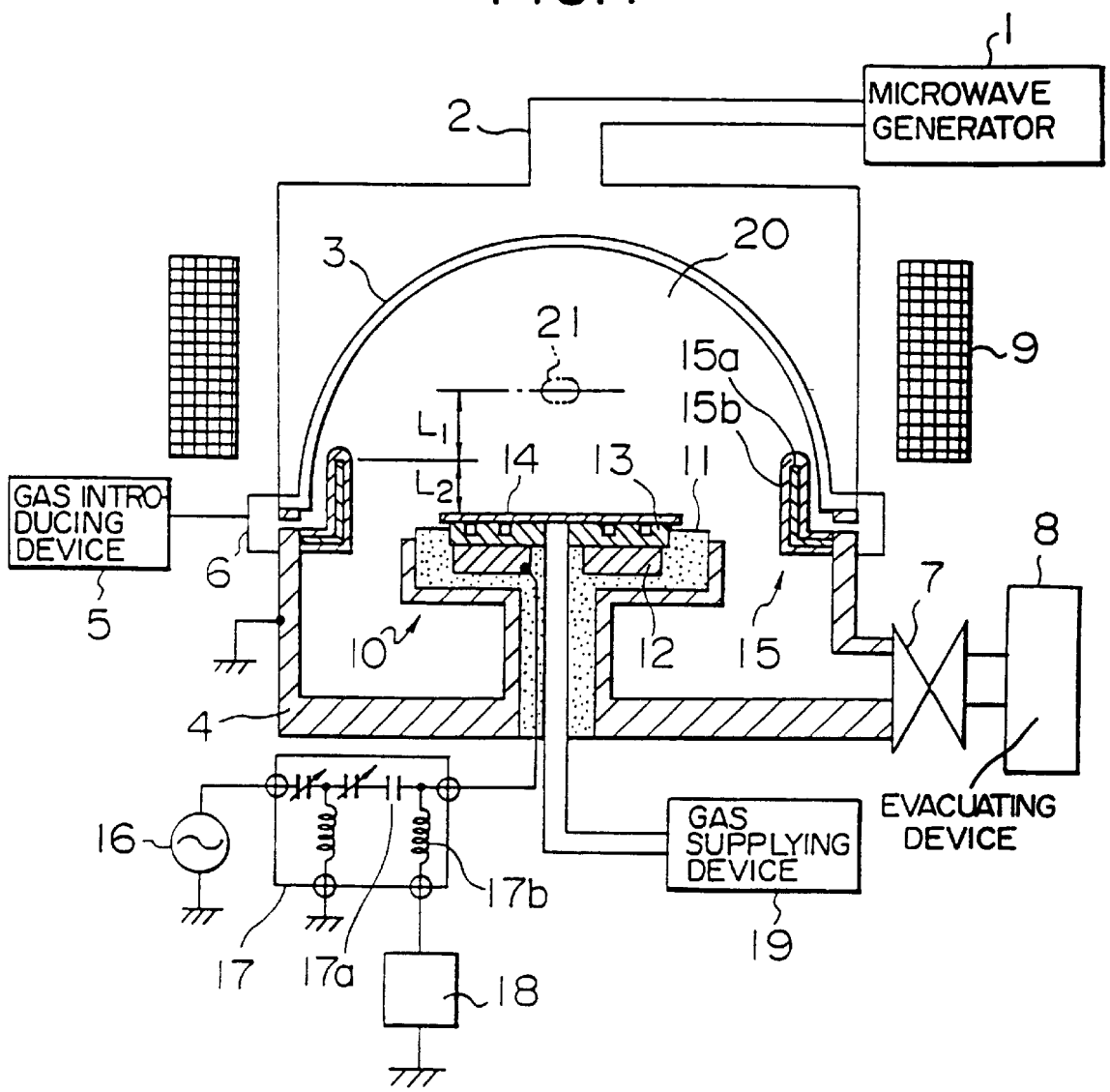
FIG. 1 is a diagram showing the structure of an embodiment of a microwave plasma processing apparatus according to the present invention.
Figure 2:
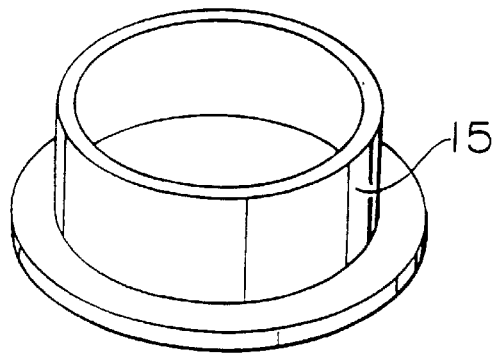
FIG. 2 is a perspective view showing a ground electrode of the apparatus in FIG. 1.
Figure 3:
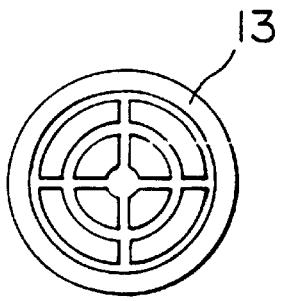
FIG. 3 is a plan view showing the configuration of the upper surface of a dielectric body on which a sample is placed in the apparatus in FIG. 1.

FIGS. 1–3 show one embodiment of a microwave plasma processing apparatus according to the present invention.

A sample table 10 is disposed in a metal vessel 4. The metal vessel 4 has an opening at the top, and a hemispherical quartz bell jar 3 is hermetically mounted over the opening to form a vacuum chamber. The quartz bell jar 3 defines a plasma generating space 20 above a surface of the sample table 10 on which a sample 14 to be subjected to plasma processing is placed during operation of the apparatus.

The metal vessel 4 is grounded, and a ring-shaped ground electrode 15 as shown in FIG. 2 is mounted in the upper portion of the metal vessel 4 and is electrically connected to the grounded metal vessel 4. The ground electrode 15 consists of an electrically conductive metal portion 15a made of a metal such as aluminum, and an insulating or semiconducting thin film 15b several tens to several hundreds of micrometers ($\mu$m) thick covering the surface of the electrically conductive metal portion 15a.

The insulating or semiconducting thin film 15b is made of (1) a material selected from the oxides and fluorides of aluminum, magnesium, and tantalum, such as alumina (aluminum oxide) or aluminum fluoride, (2) a ceramic, (3) chromium oxide, or (4) silicon carbide, and may be formed by depositing or coating a layer of the appropriate material on the electrically conductive metal portion 15a.

At the place where the insulating or semiconducting thin film 15b is formed, a potential difference is produced if an AC voltage is applied between the sample table 10 and the ground electrode 15. However, it is possible to keep this potential difference at a small value for an AC voltage having a frequency of about 100 kHz or more (including several tens of kHz below 100 kHz) if the condition $d/\xi\gamma \ll 1$ mm is satisfied, where $\xi\gamma$ denotes the specific dielectric constant of the material of the insulating or semiconducting thin film 15b and d is thickness in mm of the insulating or semiconducting thin film 15b.

The lower part of the ground electrode 15 is a flange which is secured to the metal vessel 4 such that there is a gap between the ground electrode 15 and the inner surfaces of the metal vessel 4 and the quartz bell jar 3. A gas buffer 6 connected to a gas introducing device 5 is disposed around the metal vessel 4, and a gas flow path is formed such that the gas buffer 6 is connected to the gap between the ground electrode 15 and the inner surface of the quartz bell jar 3. An evacuating device 8 is connected to the lower portion of the metal vessel 4 through a valve 7.

A waveguide 2 is disposed so as to surround the quartz bell jar 3, and a magnetron 1 for generating microwaves is connected to an end of the waveguide 2. A solenoid coil 9 for generating a magnetic field is disposed around the quartz bell jar 3 outside of the waveguide 2.

The sample table 10 is composed of an insulator body 11, an electrode 12, and a dielectric body 13. The electrode 12 is enclosed by the dielectric body 13 and the insulator body 11, and a sample 14 such as a wafer is placed on the upper surface of the dielectric body 13.

A DC power supply 18 and an AC power supply 16 are connected to the electrode 12 through a matching device 17. The DC power supply 18 applies a DC voltage to the electrode 12 to electrostatically attract the sample 14 to the electrode 12. The AC power supply 16 applies a high-frequency AC voltage to the electrode 12 to produce a bias voltage. The DC power supply 18 is connected to the electrode 12 through a circuit element 17b of the matching device 17 consisting of an inductance or a resistor which blocks the high-frequency AC voltage from the AC power supply 16. The AC power supply 16 is connected to the electrode 12 through a circuit element 17a of the matching device 17 consisting of a capacitor which blocks the DC voltage from the DC power supply 18.

A gas flow path connected to the upper surface of the dielectric body 13 on which the sample 14 is placed is formed in the sample table 10, and the gas flow path is connected to a gas supplying device 19. A cross-shaped groove and a plurality of ring-shaped grooves as shown in FIG. 3 are formed in the upper surface of the dielectric body 13 on which the sample 14 is placed, so that a thermally conductive gas such as helium can be uniformly supplied to the lower surface of the sample 14. The temperature of the sample 14 can be controlled by controlling the temperature of the thermally conductive gas supplied to the lower surface of the sample 14, although means for doing this is not shown in FIG. 1.

In the microwave plasma processing apparatus described above, a processing gas, such as an etching gas, supplied from the gas introducing device 5 is introduced uniformly into the vacuum chamber at a plurality of places on the inner periphery of the metal vessel 4 through the gas buffer 6, rises upward along the inner surface of the quartz bell jar 3, and is evacuated downward from the vacuum chamber by the evacuating device 8. The pressure in the vacuum chamber is kept at a predetermined level by the evacuating device 8.

Microwaves having a frequency of 2.45 GHz are generated by the magnetron 1, and are introduced into the vacuum chamber through the waveguide 2 and the quartz bell jar 3. A magnetic field having an intensity of 875 gauss is generated in the vacuum chamber by the solenoid coil 9 such that magnetic lines of force are approximately perpendicular to the sample 14.

An etching plasma is generated in the plasma generating space 20 defined by the quartz bell jar 3 by interaction of the etching gas, the microwaves, and the magnetic field. The etching plasma generated in the plasma generating space 20 includes an area of high-intensity plasma which is generated in an ECR (electron cyclotron resonance) region 21 in which the microwaves having a frequency of 2.45 GHz and the magnetic field having an intensity of 875 gauss interact.

A high-frequency AC voltage having a frequency of several tens of kHz to several tens of MHz is applied between the electrode 12 and the ground electrode 15 by the AC power supply 16 through the matching device 17. Since the ground electrode 15 is located at a place where the plasma is relatively dense, the potential difference between the plasma and the ground electrode 15 is small, and thus the high-frequency AC voltage can be applied stably between the plasma and the sample 14 with a high efficiency, i.e. without fluctuations. The application of this high-frequency AC voltage produces a bias voltage which attracts ions in the plasma towards the sample 14 in a uniform direction, making it possible to stably perform anisotropic etching of the sample 14 at a high rate.

According to an experiment, it was found that the plasma can be stably generated without fluctuations if the ground electrode 15 is located such that a distance $L_1$ from the ECR region 21 to the top of the ground electrode 15 is approximately equal to ½, or ½ multiplied by an integer, of the guide wavelength $\lambda g$ of the microwaves. Furthermore, it is preferable that the distance $L_2$ from the top of the ground electrode 15 to the sample 14 is about $(n+1) \cdot \lambda g/2$, where n is an integer such as 0, 1, 2, . . . . Since the insulating or semiconducting thin film 15b of the ground electrode 15 is extremely thin, the thickness of the insulating or semiconducting thin film 15b can be neglected in determining $L_1$ and $L_2$.

It is preferable that the surface area of the ground electrode 15 is greater than the surface area of the sample 14.

Since the electrically conductive metal portion 15a of the ground electrode 15 is covered by the insulating or semiconducting thin film 15b which is only several tens to several hundreds of micrometers thick and thus has no influence on the application of the high-frequency AC voltage, the electrically conductive metal portion 15a is not exposed directly to the plasma. Since it is not subjected to sputtering, etc., by ions in the plasma, the electrically conductive metal portion 15a is not consumed by the plasma, and thus it is possible to prevent metal contamination of the sample 14.

Thus, the insulating or semiconducting thin film 15b acts as an insulating plasma barrier or an insulating liner disposed adjacent to metallic portions of the vacuum chamber which would otherwise be exposed to the plasma.

If the insulating or semiconducting thin film 15b is formed by depositing or coating a layer of ceramic material on the electrically conductive metal portion 15a, the insulating or semiconducting thin film 15b will not be consumed by the plasma.

In the embodiment described above, even though the ground electrode 15 surrounds the sample table 10 and is located in the neighborhood of the region where intense plasma is generated in the plasma generating space 20, i.e. it is located on the microwave introduction side with respect to the surface of the sample table 10 on which the sample 14 is placed, the ground electrode 15 is not consumed by the plasma because it is covered by the insulating or semiconducting thin film 15b which is so thin that it has no influence on the application of the high-frequency voltage. Thus, it is possible to obtain a stable plasma having no fluctuations in the intensity of the plasma and to perform stable plasma processing without any metal contamination of the sample 14.

After etching processing has been carried out for a long time, an inner surface of the vacuum chamber including the surface of the insulating or semiconducting thin film 15b may become covered by deposits of undesired materials. If this occurs, the deposits of undesired materials may be removed by generating a cleaning plasma from a halogen-containing gas in the vacuum chamber after removing the sample 14.

Furthermore, since the ground electrode 15 defines part of a gas flow path wherein the processing gas is supplied to the upper portion of the vacuum chamber along the inner surface of the quartz bell jar 3 and then flows from the upper to the lower portion of the vacuum chamber, fresh processing gas is continually supplied to the neighborhood of the region where intense plasma is produced. In this way, processing can be effected with a high efficiency, i.e. with a high rate.

Although in the present embodiment the ECR region 21 has been described as an area where microwaves having a frequency of 2.45 GHz and a magnetic field having an intensity of 875 gauss interact, the present invention is not limited to these values because the intensity of the magnetic field satisfying the ECR condition varies if the frequency of the microwaves varies.

Although in the present embodiment the waveguide 2 has been used to transmit the microwaves from the magnetron 1 to the quartz bell jar 3, a coaxial cable, etc., may be used instead of the waveguide 2. Furthermore, the waveguide 2 may include means for monitoring incident and reflected waves by means of an isolator or a directional coupler, etc., although these elements are not shown in FIG. 1.

Figure 4:
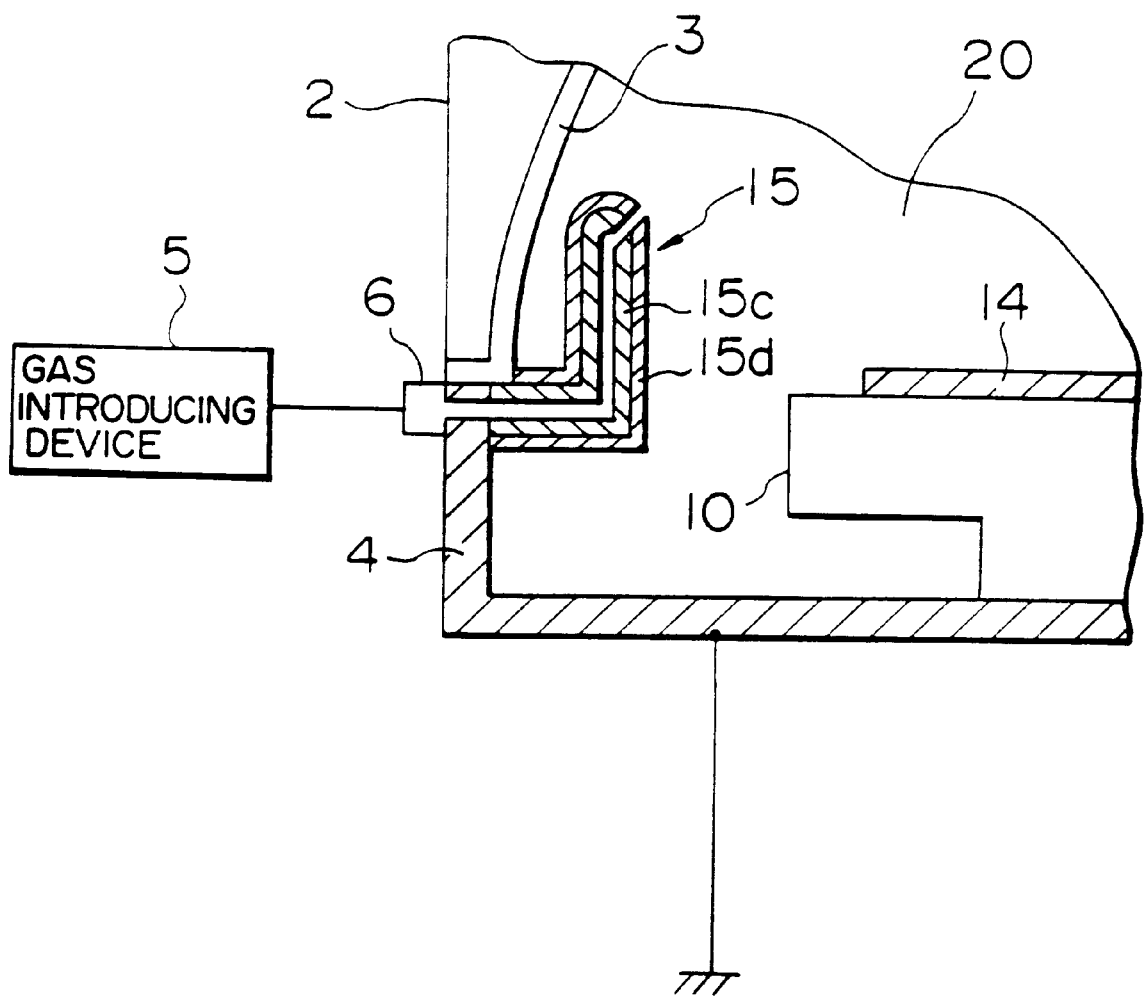
FIG. 4 is a cross-sectional view showing a portion of a modification of the apparatus in FIG. 1.

Furthermore, although in the present embodiment the processing gas flows to the upper portion of the vacuum chamber through the gap between the ground electrode 15 and the inner surface of the quartz bell jar 3, the gas flow path may be formed in an electrically conductive metal portion 15c of the ground electrode 15 as shown in FIG. 4 so that the processing gas flows towards the upper portion of the vacuum chamber from the top of the ground electrode 15. The ground electrode 15 in FIG. 4 includes an insulating or semiconducting thin film 15d covering the surface of the electrically conductive metal portion 15c which is similar to the insulating or semiconducting thin film 15b.

Figure 5:
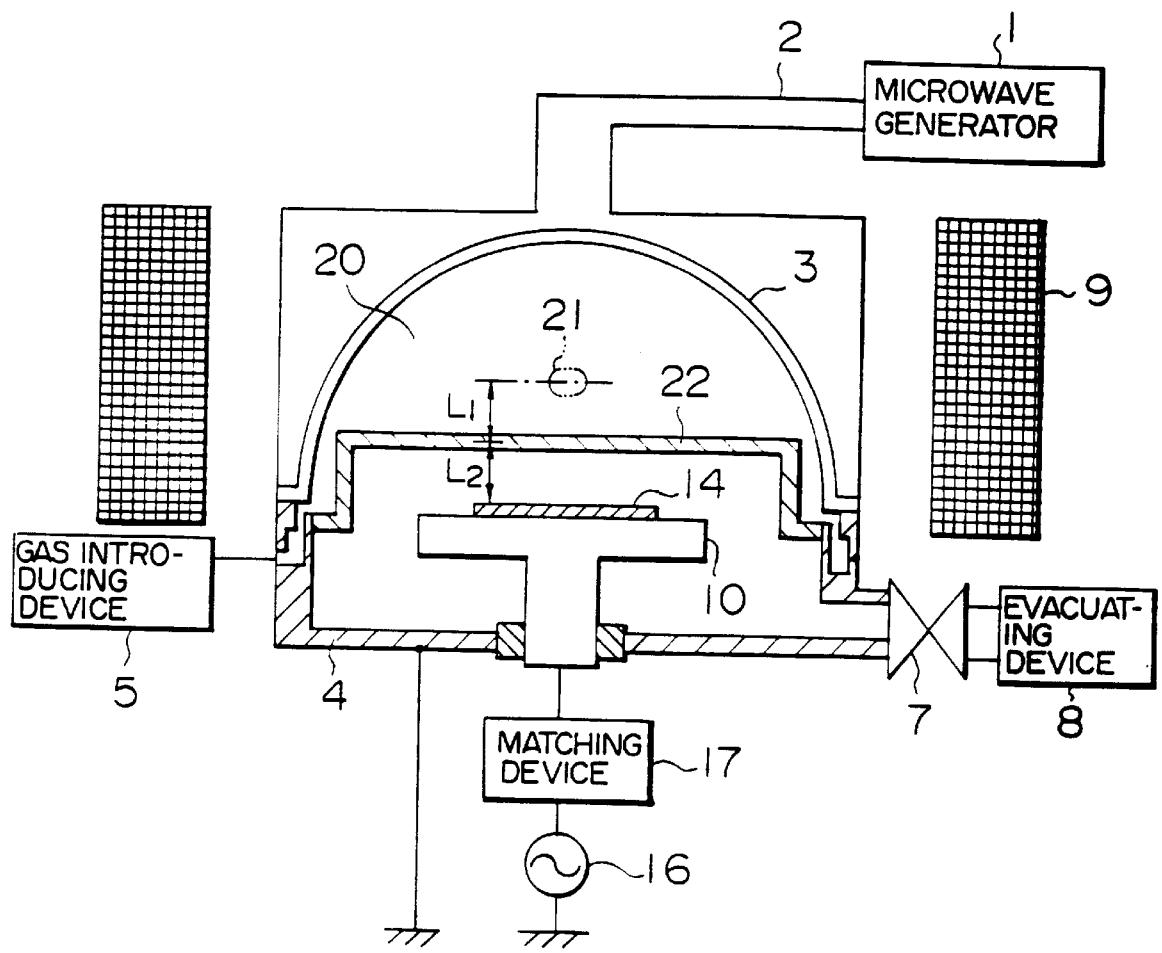
FIG. 5 is a diagram showing the structure of another embodiment of a microwave plasma processing apparatus according to the present invention.
Figure 6:
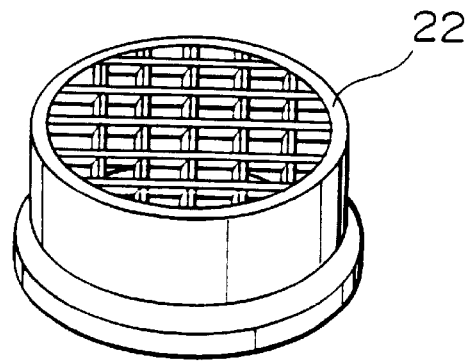
FIG. 6 is a perspective view showing a ground electrode of the apparatus in FIG. 5.

FIGS. 5–6 show another embodiment of a microwave plasma processing apparatus according to the present invention.

In FIGS. 5–6, reference numerals identical to those in FIGS. 1–3 represent the same elements, and description thereof will be omitted. What is different in the apparatus in FIGS. 5–6 from that shown in FIGS. 1–3 is that the upper portion of the ground electrode 22 is formed in a mesh shape, that the gas buffer for supplying the processing gas is formed within the metal vessel 4, and that only a high-frequency AC voltage is applied to the sample table 10. The ground electrode 22 includes a mesh-shaped metal portion on a plane opposite to the surface of the sample 14 to be processed. In this case, the distance $L_1$ between the ECR region 21 and the mesh and the distance $L_2$ between the mesh and the surface of the sample 14 are determined in the manner identical to that used in the embodiment of FIGS. 1–3. It is desirable that the pitch of the mesh is greater than 10 mm so as not to obstruct ions, particles, etc. The shape of the mesh is not limited to a rectangle as shown in FIG. 6, but a mesh consisting of rings having different radii in the peripheral direction and a cross in the radial direction made of metal, etc., may be used.

The ground electrode 22 is covered by an insulating or semiconducting thin film similar to that used in the embodiment of FIGS. 1–3.

According to the embodiment of FIGS. 5–6, effects similar to those described for the embodiment of FIGS. 1–3 are obtained, and since it is possible to apply a high-frequency AC voltage to the whole area of the plasma, a more stable plasma can be obtained.

It may happen that a shadow of the mesh is transferred to the surface of the sample 14 due to the fact that the mesh-shaped ground electrode 22 is disposed above the sample 14. This can be avoided by superposing an AC current on a DC current flowing through the solenoid coil 9 to displace ions in the plasma in a transverse direction in the vacuum chamber.

Figure 7:
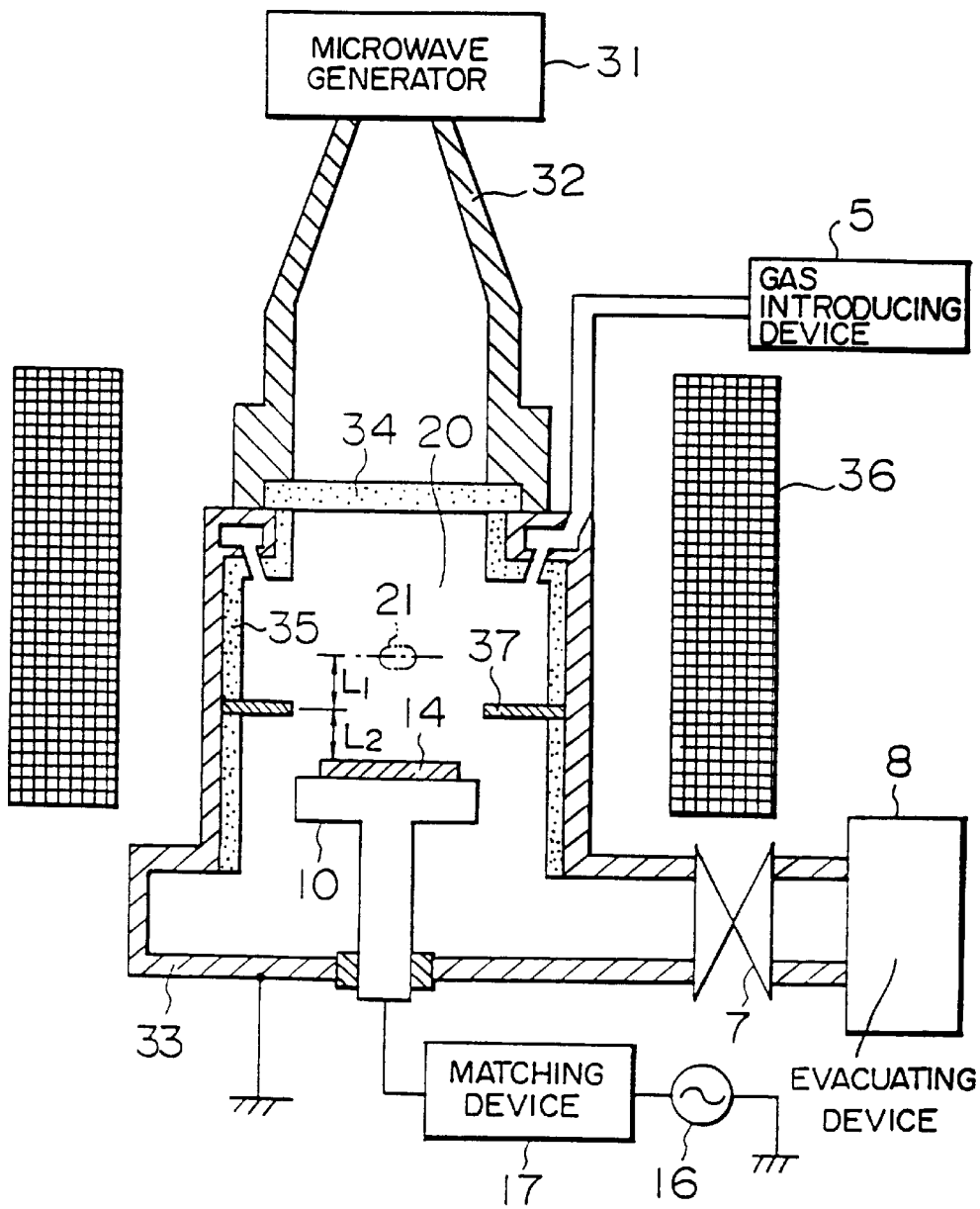
FIG. 7 is a diagram showing the structure of another embodiment of a microwave plasma processing apparatus according to the present invention.
Figure 8:
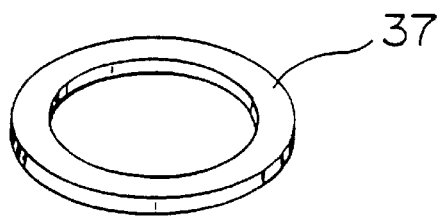
FIG. 8 is a perspective view showing a ground electrode of the apparatus in FIG. 7.

FIGS. 7–8 show another embodiment of a microwave plasma processing apparatus according to the present invention.

In FIGS. 7–8, reference numerals identical to those in FIGS. 1–3 represent the same elements, and description thereof will be omitted. A vacuum chamber is composed of a metal vessel 33 and a plate 34 made of quartz mounted hermetically on an opening in the upper portion of the metal vessel 33. An insulating layer 35 is disposed on the surface of the part forming the plasma generating space 20 in the upper portion of the metal vessel 33. The sample table 10 is formed so as to be extended to the space where the insulating layer 35 is disposed in the metal vessel 33. A waveguide 32 is disposed on the metal vessel 33 covering the quartz window 34 and extending upward and a magnetron 31 is mounted on the upper end portion of the waveguide 33. A gas buffer is formed in the upper portion of the metal vessel 33 so that the processing gas can be supplied from the processing gas introducing device 5 to the upper portion of the discharge space. The evacuating device 8 is connected to the lower portion of the metal vessel 33 through the valve 7. A solenoid coil 36 is wound on the outer periphery of the upper portion of the metal vessel 33. A ground electrode 37 is mounted with the metal vessel 33 disposed to the microwave introduction side with respect to the surface of the sample table on which the sample is placed, and is formed as a doughnut-shaped plate. The ground electrode 37 is connected electrically with the grounded metal vessel 33. The position of the ground electrode 37 is determined by the distances $L_1$ and $L_2$ from the ECR region 21 and the surface of the sample 14 similarly to the mesh in the embodiment shown in FIGS. 5–6 described previously. The surface of the ground electrode 37 is covered by a insulating or semiconducting thin film similar to the insulating or semiconducting thin film 15b of the embodiment of FIGS. 1–3.

In the apparatus in FIGS. 7–8, the processing gas is supplied directly to the upper portion of the vacuum chamber and flows downward to be evacuated from the bottom of the vacuum chamber. In this way, the pressure is reduced to a predetermined value and kept at that value. In this state, the microwaves and the magnetic field are made to interact with the processing gas to generate plasma similarly to the embodiment of FIGS. 1–3. At this time, since the upper portion of the ground electrode 37 is formed as a doughnut-shaped plate, the contact area with the plasma at the distance $L_2$ from the ECR region 21 is increased and it is possible to apply a high-frequency AC voltage to a wide region of the plasma to stabilize the plasma.

As described above, according to the present invention, since effects similar to those obtained by the embodiment of FIGS. 1–3 are obtained and it is possible to apply a high-frequency AC voltage to a wide region of the plasma, a more stable plasma can be obtained.

Furthermore, as shown in these embodiments, it is possible to apply a high-frequency AC voltage to the plasma without any metal contamination with a high efficiency not only for the apparatus in which the periphery of the part where discharge takes place is surrounded by an insulating layer, as shown in FIG. 1, but also for the apparatus in which the periphery of the part where discharge takes place is surrounded by metal, as shown in FIG. 7, by disposing the ground electrode whose surface is covered by an insulating or semiconducting thin film on the plasma generating side with respect to the surface of the sample table on which the sample is placed.

Figure 9:
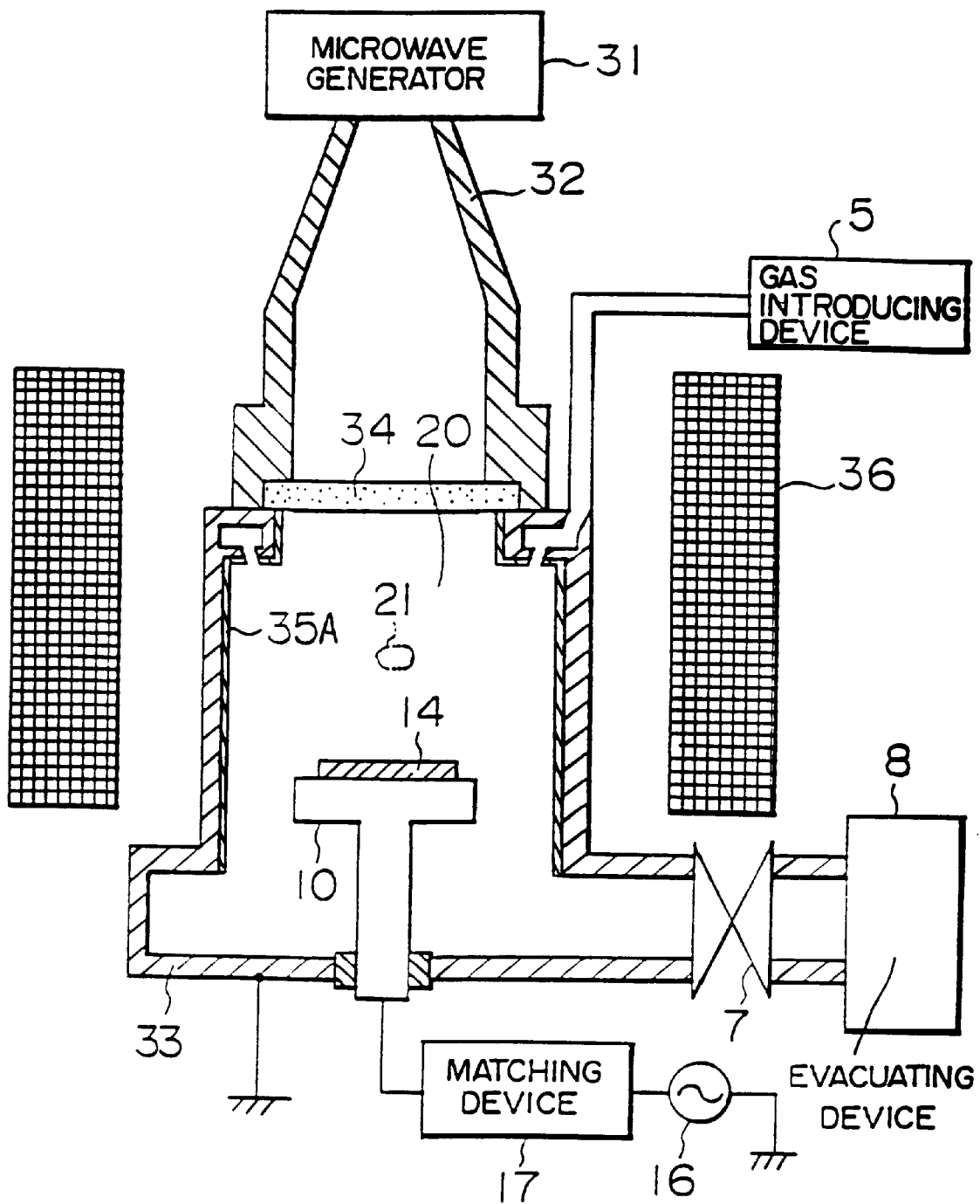
FIG. 9 is a diagram showing the structure of another embodiment of a microwave plasma processing apparatus according to the present invention.

FIG. 9 shows another embodiment of a microwave plasma processing apparatus according to the present invention.

In this embodiment, the metal vessel 33 serves as a ground electrode for the bias application by the AC power supply 16, and a portion of the inner surface of metal vessel 33 facing the sample 14 mounted on the sample table 10 is covered by an insulating or semiconducting thin film 35A whose thickness is less than 1 mm. This insulating or semiconducting thin film 35A prevents metal contamination from the metal vessel 33 serving as the ground electrode, and is similar to the insulating or semiconducting thin film 15b of the embodiments of FIGS. 1–3. Therefore, according to this embodiment, the ground electrode 37 in FIG. 7 can be eliminated.

In FIGS. 7 and 9, the films 35 and 35A may be a bulk free-standing ceramic member having a thickness of several hundred micrometers formed separately from the metal vessel 33.

Although in these embodiments examples were given in which etching processing is effected by using an etching gas as the processing gas, the present invention can be applied to a sputtering apparatus, a film forming apparatus such as a CVD apparatus, etc., by changing the processing gas to an appropriate gas.

Although all of the embodiments described above relate to plasma processing of the microwave type, the present invention can be applied to any other type of plasma processing if a high-frequency coupling technique such as capacitive coupling, inductive coupling, or direct coupling is used with or without a magnetic field.

According to the present invention, an effect that stable plasma processing can be performed without any metal contamination is obtained.

We claim:

1. A plasma processing apparatus comprising:
a plasma processing chamber defining a plasma region, the plasma processing chamber having an inner metallic portion defining at least a portion of the plasma region;
a sample table disposed in the plasma region for holding a sample to be subjected to plasma processing;
means for applying an AC voltage to the sample table;
means for generating a plasma in the plasma region independently of the AC voltage applied to the sample table such that the AC voltage applied to the sample table has no effect on the generation of the plasma, the plasma including a region of intense plasma; and
an insulator having a thickness of several tens to several hundreds of micrometers ($\mu$m) disposed on the inner metallic portion of the plasma processing chamber in a neighborhood of the region of intense plasma.

2. A method of plasma processing comprising the steps of:
disposing an insulator having a thickness of several tens to several hundreds of micrometers ($\mu$m) on an inner metallic portion of a plasma processing chamber, the plasma processing chamber defining a plasma region, the inner metallic portion of the plasma processing chamber defining at least a portion of the plasma region;
disposing a sample on a sample table disposed in the plasma region;
applying an AC voltage to the sample table; and
generating a plasma in the plasma region independently of the AC voltage applied to the sample table such that the AC voltage applied to the sample table has no effect on the generation of the plasma, thereby subjecting the sample to plasma processing, the plasma including a region of intense plasma;
wherein the insulator having a thickness of several tens to several hundreds of micrometers ($\mu$m) is disposed on the inner metallic portion of the plasma processing chamber in a neighborhood of the region of intense plasma.

3. A plasma processing apparatus comprising:
a plasma processing chamber defining a plasma region, the plasma processing chamber having an electrode defining at least a portion of the plasma region;
a sample table disposed in the plasma region for holding a sample to be subjected to plasma processing;
means for generating a plasma in the plasma region, the plasma including a region of intense plasma;
means for applying a voltage to the sample table, the voltage producing a bias voltage which attracts ions in the plasma towards the sample table; and
an insulator disposed on the electrode of the plasma processing chamber;
wherein the electrode is located in a neighborhood of the region of intense plasma.

4. A plasma processing apparatus according to claim 3, wherein the electrode of the plasma processing chamber is coupled to ground.

5. A plasma processing apparatus according to claim 3, wherein the insulator has a thickness of several tens to several hundreds of micrometers ($\mu$m).

6. A method of plasma processing comprising the steps of:
disposing an insulator on an electrode of a plasma processing chamber, the plasma processing chamber defining a plasma region, the electrode of the plasma processing chamber defining at least portion of the plasma region;

disposing a sample on a sample table disposed in the plasma region;

generating a plasma in the plasma region, thereby subjecting the sample to plasma processing, the plasma including a region of intense plasma; and applying a voltage to the sample table, the voltage producing a bias voltage which attracts ions in the plasma towards the sample table;

wherein the electrode is located in a neighborhood of the region of intense plasma.

7. A method of plasma processing according to claim 6, wherein the electrode of the plasma processing chamber is coupled to ground.

8. A method of plasma processing according to claim 6, wherein the insulator has a thickness of several tens to several hundreds of micrometers ($\mu$m).

9. A plasma processing apparatus comprising:

a plasma processing chamber defining a plasma region, the plasma processing chamber having an inner metallic portion defining at least a portion of the plasma region;

a sample table disposed in the plasma region for holding a sample to be subjected to plasma processing;

means for applying an AC voltage to the sample table;

means for generating a plasma in the plasma region independently of the AC voltage applied to the sample table such that the AC voltage applied to the sample table has no effect on the generation of the plasma, the plasma including a region of intense plasma; and oxidized aluminum having a thickness of several tens to several hundreds of micrometers ($\mu$m) disposed on the inner metallic portion of the plasma processing chamber in a neighborhood of the region of intense plasma.

10. A method of plasma processing comprising the steps of:

disposing oxidized aluminum having a thickness of several tens to several hundreds of micrometers ($\mu$m) on an inner metallic portion of a plasma processing chamber, the plasma processing chamber defining a plasma region, the inner metallic portion of the plasma processing chamber defining at least a portion of the plasma region;

disposing a sample on a sample table disposed in the plasma region;

applying an AC voltage to the sample table; and generating a plasma in the plasma region independently of the AC voltage applied to the sample table such that the AC voltage applied to the sample table has no effect on the generation of the plasma, thereby subjecting the sample to plasma processing, the plasma including a region of intense plasma;

wherein the oxidized aluminum having a thickness of several tens to several hundreds of micrometers ($\mu$m) is disposed on the inner metallic portion of the plasma processing chamber in a neighborhood of the region of intense plasma.

11. A plasma processing apparatus comprising:

a plasma processing chamber defining a plasma region, the plasma processing chamber being grounded and having an inner surface facing the plasma region;

a sample table disposed in the plasma region for holding a sample to be subjected to plasma processing;

means for generating a plasma in the plasma region, the plasma including a region of intense plasma;

means for applying a voltage to the sample table, the voltage producing a bias voltage which attracts ions in the plasma towards the sample table; and an insulator having a thickness of several tens to several hundreds of micrometers ($\mu$m) disposed on at least a portion of the inner surface of the plasma processing chamber in a neighborhood of the region of intense plasma.

12. A plasma processing apparatus according to claim 11, wherein the insulator is oxidized aluminum.

13. A method of plasma processing comprising the steps of:

disposing an insulator having a thickness of several tens to several hundreds of micrometers ($\mu$m) on at least a portion of an inner surface of a plasma processing chamber, the plasma processing chamber defining a plasma region and being grounded, the inner surface of the plasma processing chamber facing the plasma region;

disposing a sample on a sample table disposed in the plasma region;

generating a plasma in the plasma region, thereby subjecting the sample to plasma processing, the plasma including a region of intense plasma; and applying a voltage to the sample table, the voltage producing a bias voltage which attracts ions in the plasma towards the sample table;

wherein the insulator having a thickness of several tens to several hundreds of micrometers ($\mu$m) on is disposed on at least a portion of the inner surface of the plasma processing chamber in a neighborhood of the region of intense plasma.

14. A method of plasma processing according to claim 13, wherein the insulator is oxidized aluminum.

15. A plasma processing apparatus comprising:

a plasma processing chamber defining a plasma region, the plasma processing chamber having an inner metallic portion defining at least a portion of the plasma region;

a sample table disposed in the plasma region for holding a sample to be subjected to plasma processing;

a gas introducing portion for introducing gas into the plasma processing chamber, the gas introducing portion being covered by an insulator;

means for generating a plasma in the plasma region, the plasma including a region of intense plasma;

means for applying a voltage to the sample table, the voltage producing a bias voltage which attracts ions in the plasma towards the sample table; and a plasma barrier layer disposed on the inner metallic portion of the plasma processing chamber in a neighborhood of the region of intense plasma.

16. A plasma processing apparatus according to claim 15, wherein the plasma barrier layer and the insulator each have a thickness of several tens to several hundreds of micrometers ($\mu$m).

17. A method of plasma processing comprising the steps of:

disposing a plasma barrier layer on an electrode of a plasma processing chamber, the plasma processing chamber defining a plasma region, the electrode of the plasma processing chamber defining at least a portion of the plasma region;

disposing a sample on a sample table disposed in the plasma region;

covering a gas introducing portion for introducing gas into the plasma processing chamber with an insulator;

introducing gas into the plasma processing chamber through the gas introducing portion covered by the insulator;

generating a plasma in the plasma region, thereby subjecting the sample to plasma processing, the plasma including a region of intense plasma; and applying a voltage to the sample table, the voltage producing a bias voltage which attracts ions in the plasma towards the sample table;

wherein the electrode is disposed in a neighborhood of the region of intense plasma.

18. A method of plasma processing to claim 17, wherein the plasma barrier layer and the insulator each have a thickness of several tens to several hundreds of micrometers ($\mu$m).

19. A plasma processing apparatus comprising:

a plasma processing chamber defining a plasma region, the plasma processing chamber being grounded and having an inner surface facing the plasma region;

a sample table disposed in the plasma region for holding a sample to be subjected to plasma processing;

a gas introducing portion for introducing gas into the plasma processing chamber, the gas introducing portion being covered by an insulator;

means for generating a plasma in the plasma region, the plasma including a region of intense plasma;

means for applying a voltage to the sample table, the voltage producing a bias voltage which attracts ions in the plasma towards the sample table; and a plasma barrier layer disposed on at least a portion of the inner surface of the plasma processing chamber in a neighborhood of the region of intense plasma.

20. A plasma processing apparatus according to claim 19, wherein the plasma barrier layer and the insulator each have a thickness of several tens to several hundreds of micrometers ($\mu$m).

21. A plasma processing apparatus comprising:

a plasma processing chamber defining a plasma region, the plasma processing chamber being grounded and having an inner surface facing the plasma region;

a sample table disposed in the plasma region for holding a sample to be subjected to plasma processing;

a gas introducing portion for introducing gas into the plasma processing chamber;

means for generating a plasma in the plasma region, the plasma including a region of intense plasma;

means for applying a voltage to the sample table, the voltage producing a bias voltage which attracts ions in the plasma towards the sample table; and a plasma barrier layer disposed on at least a portion of the inner surface of the plasma processing chamber in a neighborhood of the region of intense plasma;

wherein the gas introducing portion includes an electrically conductive member and an electrical insulator covering the electrically conductive member to an extent so that the electrically conductive member is not directly exposed to the plasma in the plasma region.

* * * * *